United States Patent [19]

Slobodnik, Jr. et al.

[11] Patent Number: 4,712,078
[45] Date of Patent: Dec. 8, 1987

[54] DIELECTRIC RESONATOR OSCILLATORS WITH DIGITAL TEMPERATURE COMPENSATION

[75] Inventors: Andrew J. Slobodnik, Jr., Londonderry, N.H.; Martin R. Stiglitz, Lexington, Mass.; George A. Roberts, Weston, Mass.; Richard T. Webster, Bedford, Mass.

[73] Assignee: The United States of America as represented by the Secretary of the Air Force, Washington, D.C.

[21] Appl. No.: 716,729

[22] Filed: Mar. 27, 1985

[51] Int. Cl.$^4$ .......................... H03B 5/18; H03L 1/02
[52] U.S. Cl. ........................................ 331/99; 331/176
[58] Field of Search ..................... 331/96, 99, 107 SL, 331/117 D, 176

[56] References Cited

U.S. PATENT DOCUMENTS

| | | | |
|---|---|---|---|
| 3,719,838 | 3/1973 | Peduto et al. | 331/176 X |
| 4,380,745 | 4/1983 | Barlow et al. | 331/176 |
| 4,386,326 | 5/1983 | Yoshimura | 331/96 |
| 4,415,870 | 11/1983 | Zumsteg | 331/176 |
| 4,427,952 | 1/1984 | Zumsteg | 331/176 |
| 4,445,097 | 4/1984 | Godart et al. | 331/117 D |
| 4,454,483 | 6/1984 | Baylor | 331/11 |
| 4,489,289 | 12/1984 | Slobodnik et al. | 331/107 A |
| 4,513,259 | 4/1985 | Frerking | 331/176 |

FOREIGN PATENT DOCUMENTS

2064248  6/1981  United Kingdom ................ 331/176

OTHER PUBLICATIONS

Slobodnik et al., "16 GHz Dielectric Resonator Oscillator with Digital Temperature Compensation", Microwave Journal, Nov. 1984, pp. 155-166.
Lee et al., "Digital and Analog Frequency-Temperature Compensation of Dielectric Resonator Oscillators", 1984 IEEE MTT-S Digest, pp. 277-279.

Primary Examiner—Siegfried H. Grimm
Attorney, Agent, or Firm—William G. Auton; Donald J. Singer

[57] ABSTRACT

A digital compensation circuit for improving the temperature stability of dielectric resonator oscillators is disclosed. A temperature sensor indicates a measure of ambient temperature which is correlated with an amount of phase shift necessary to compensate for frequency drift in a dielectric resonator oscillator. The correlation is made using a correction table or correction function which is determined empirically in a calibration process. The necessary phase shift is then supplied via a voltage controlled phase shifter. This phase shifter is part of the RF oscillation loop which also includes an amplifier, directional coupler and dielectric resonator filter (including microstrip).

13 Claims, 6 Drawing Figures

DIELECTRIC RESONATOR OSCILLATORS WITH DIGITAL TEMPERATURE COMPENSATION

STATEMENT OF GOVERNMENT INTEREST

The invention described herein may be manufactured and used by or for the Government for governmental purposes without the payment of any royalty thereon.

BACKGROUND OF THE INVENTION

Although the initial publication of the dielectric resonator dates back to 1939, its development and application have been held back due to temperature sensitivity. Martin Stiglitz, in his article entitled "Dielectric Resonators: Past, Present, and Future", *Microwave Journal*, vol. 24, pp 19–36, July 1981; observes a number of breakthroughs in dielectric resonator materials that have served to reduce the effects of temperature.

With the development of high dielectric constant, high Q, low loss, temperature compensated ceramic materials, the dielectric resonator stabilized oscillator (DRO) has become a practical, useful device. However, dielectric resonator oscillators still experience the problem of frequency drift with changes in temperature.

The task of compensating for the temperature sensitivity of dielectric resonator oscillators has been reduced, to some extent by the following U.S. Patents, which are incorporated herein by reference:

U.S. Pat. No. 4,489,289 issued to Slobodnik et al;
U.S. Pat. No. 4,380,745 issued to Barlow et al;
U.S. Pat. No. 4,386,326 issued to Yoshimura;
U.S. Pat. No. 4,415,870 issued to Zumsteg;
U.S. Pat. No. 4,427,952 issued to Zumsteg;
U.S. Pat. No. 4,445,097 issued to Godart et al; and
U.S. Pat. No. 4,454,483 issued to Baylor.

Slobodnik et al disclose a method of digital temperature compensation of surface acoustic wave (SAW) oscillators. This involves the use of two oscillator paths on the same SAW substrate, one of which serves as a temperature sensor.

Godart et al disclose a microstrip transistor oscillator with dielectric resonator stabilization. The patented resonator has a very low temperature coefficient and is used at a frequency of 3 to 10 GHz. Yoshimura discusses an 11–12 GHz oscillator with a dielectric resonator of a large dielectric constant and a high Q factor. Barlow et al show a digitally controlled temperature compensation circuit for a crystal oscillator. The correction signal is generated by a digital frequency synthesizer controlled by a programmable read-only memory. A program in the memory generates the required correction frequency for each temperature code over the operating temperature range. The temperature code is generated by gating a digital counter with the output of a monostable multivibrator which utilizes a thermistor to make its gate interval proportional to temperature. In Baylor temperature compensation of an oscillator is by a fractional cycle synthesis. A digital signal representing temperature is generated by an analog-to-digital converter from a temperature sensor. A signal representing the relationship between crystal frequency and temperature is stored in a memory and after appropriate treatment is injected into a phase locked loop containing a voltage-controlled oscillator. The two Zumsteg patents are both directed to oscillator circuits with digital temperature compensation in which the correction factor is stored in a PROM.

The following references are pertinent to the present invention:

Frerking, M. E. Crystal Oscillator Design and Temperature Compensation, Van Nostrand, New York 1978;

Lee, J., J. E. Andrews, K. W. Lee, and W. R. Day, "Digital and Analog Frequency - Temperature Compensation of Dielectric Resonator Oscillators," IEEEMTT-S Digest, pp 277–279, 1984.

The Frerking reference contains a general discussion of temperature compensation in the context of bulk mode devices and generally with temperature sensing external to the crystal.

The publication of Lee et al contains a description of a system which provides digital temperature compensation to dielectric resonator oscillators.

Also, Varian has advertised (Microwave Journal, May 1984, page 21) a commercial temperature compensation system having an average temperature stability of 0.36 ppm/° C.

Our solution to the problem of temperature correction is an approach which allows temperature compensation to be performed over a tunable frequency range by providing temperature sensitive phase shift feedback to dielectric resonator oscillator loops. The present invention is intended to provide this solution in the form of digital temperature correction to a phase shift circuit in a dielectric resonator oscillator loop.

SUMMARY OF THE INVENTION

The present invention is an apparatus and process of providing temperature compensation to dielectric resonator oscillators over a tunable frequency range.

The dielectric resonator oscillator, known in the art, consists, in part, of a dielectric resonator disk which is electromagnetically coupled with microstrip lines. The electromagnetic field surrounding the disk induces the desired frequency signal in the microstrip, but this frequency signal is normally subject to the problem of frequency drift with changes in temperature.

In the present invention, a temperature sensing feedback circuit is added to the basic oscillator to reduce its temperature sensitivity. This oscillator, including temperature sensing feedback circuit, in one embodiment, consists of: a dielectric resonator filter (implemented with microstrip), a phase shifter for frequency tuning, an amplifier, a directional coupler, a temperature sensing means, and a phase shifter setting means. The temperature sensing means provides a digital indication of the ambient temperature to the phase shifter setting means. At each temperature the phase shifter setting necessary to maintain a stable output frequency, is provided by a precalibrated programmable read only memory (PROM, EPROM OR EEPROM) or RAM lookup table. In response to this signal the phase shifter shifts the phase of the frequency signal in the oscillator loop to provide the temperature compensation.

Placing the dielectric resonator filter in the oscillator loop with the amplifier, as described in the above embodiment, results in a simple, compact frequency source. A modified embodiment of the present invention uses a microcomputer to calculate the appropriate phase shifter setting from a preprogrammed equation.

It is a principal object of the present invention to provide a means of temperature compensation, to dielectric resonator oscillators.

It is another object of the present invention to provide temperature compensation to dielectric resonator oscillators over a tunable frequency range. Tunability is accomplished using a preprogrammed equation with a tunability variable or alternatively, a multiplicity of lookup tables or preprogrammed equations.

It is another object of the present invention to provide a simple, compact, microwave frequency source.

These together with other objects features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention is an apparatus and technique of providing temperature compensation to dielectric resonator oscillators.

Figure 1:
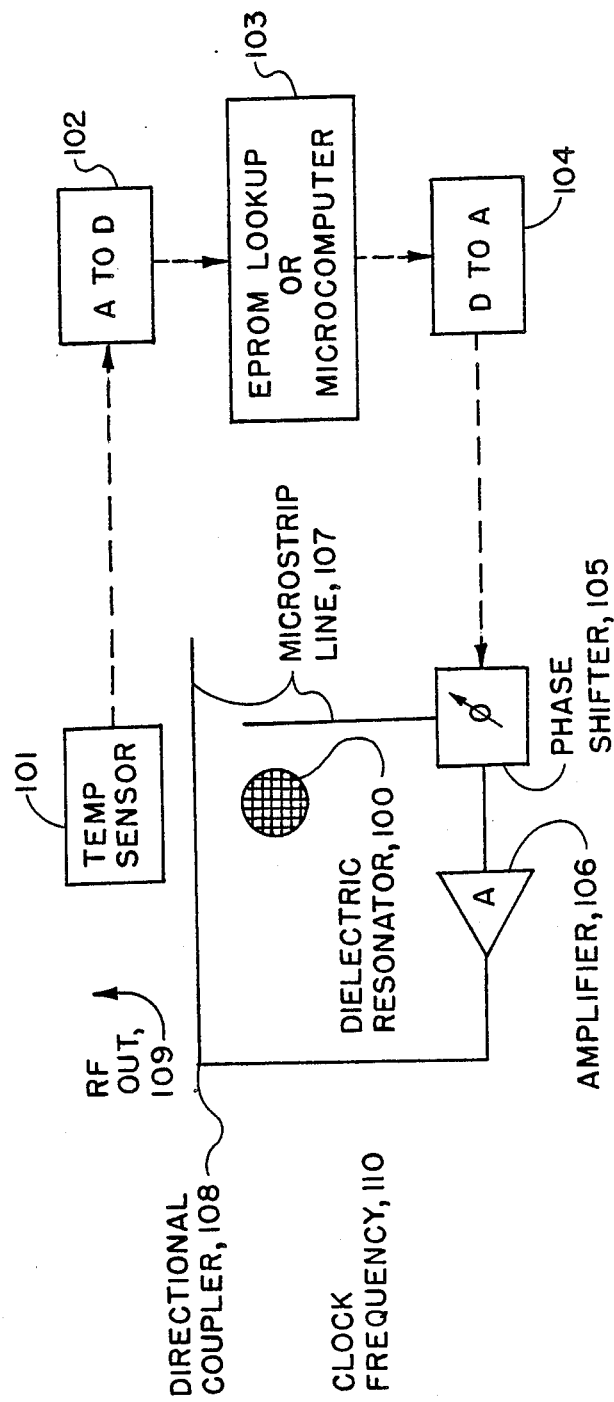
FIG. 1 is a schematic diagram of the preferred embodiment of the present invention.

FIG. 1 is a schematic diagram of the preferred embodiment of the present invention. As shown in FIG. 1, improved temperature stability is provided to a conventional dielectric resonator oscillator by placing a phase shifter in the feedback loop with the dielectric filter and amplifier to provide electronic compensation for changes in temperature sults when 290 N (N being an integer) radians of phase shift around the loop corresponds to a point of open loop gain greater than unity.

In FIG. 1, a feedback circuit has been added to the basic oscillator to improve its temperature stability. This feedback circuit contains: a temperature sensor 101, analog-to-digital (A/D) converter 102, an erasable programmable read-only-memory (EP ROM) or microcomputer 103, and a digital-to-analog converter (DAC) 104. The temperature sensor 101 and A/D converter 102 provide a digital signal which indicates the ambient temperatuer. A phase shifter setting means (consisting of the EP ROM or microcomputer 103 and DAC 104) monitors the temperature readings and provides an appropriate phase shifter voltage to continuously retune the basis loop and offset frequency drift caused by temperature variation. The correct setting is either directly available from a precalibrated memory lookup table or can be computed using a preprogrammed correction function.

Figure 2:
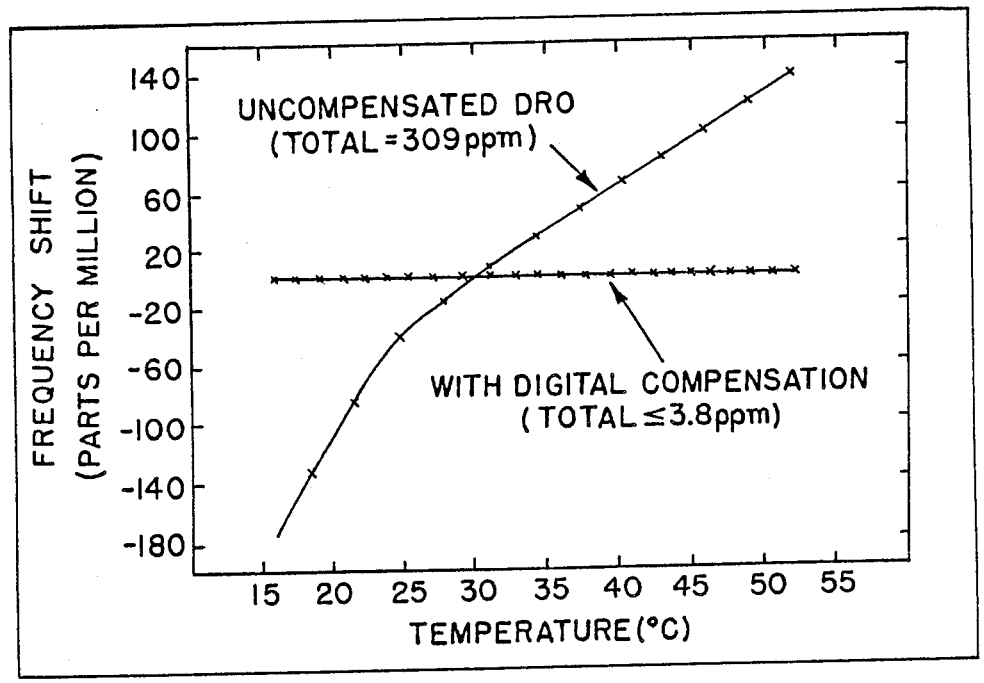
FIG. 2 is a chart illustrating the improved temperature stability of a dielectric resonator oscillator (DRO) using the present invention.

FIG. 2 is a chart illustrating the improved temperature stability of a particular dielectric resonator oscillator (DRO) when provided with the temperature sensing feedback circuit depicted in FIG. 1. The measured dielectric filter parameters for the particular oscillator of FIG. 2, are as follows: loaded Q=1327, f=16.1 GHz, and insertion loss=9.0 dB. Additional parameters for this device are given in Table 1 (case C).

Figure 3:
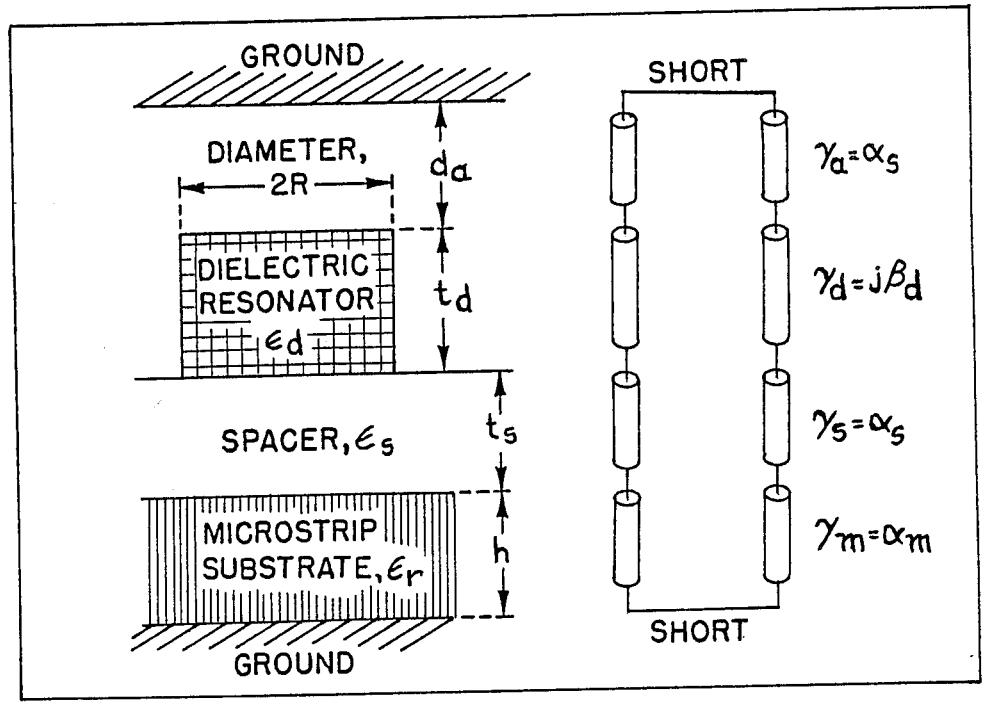
FIG. 3 is a schematic diagram depicting the terms and definitions of dielectric resonator geometry.

In order to understand the examples to Table 1, FIG. 3 is provided. FIG. 3 is a schematic diagram which depicts the terms of dielectric resonator geometry, with definitions depicted of dimensions: 2R, $d_a$, $t_d$, $t_s$, and h and relative dielectric constants $\bullet_d$, $\bullet_a$, and $\bullet_r$.

The right hand side of FIG. 3 depicts a transmission line equivalent circuit used for dielectric resonator analysis.

With the definitions of FIG. 3 understood, Table 1 is given to described three examples (A, B and C) of dielectric resonator configurations and their center frequencies.

TABLE 1

| | SUBSTRATE | | HEIGHT OF GROUND PLANE | SPACER | | COMPUTED RESONANT | EXPERIMENTAL RESONANT |
|---|---|---|---|---|---|---|---|
| | THICKNESS, h (m) | MATERIAL | ABOVE DISK, $d_a$ (m) | THICKNESS, $t_s$ (m) | MATERIAL | FREQUENCY (GHz) | FREQUENCY (GHz) |
| A | 2.54 E-4 | FUSED QUARTZ | 1.33 E-3 | 9.98 E-4 | AC QUARTZ $\epsilon_r \approx 4.55$ | 16.83 | 16.12 |
| B | | $\epsilon_r = 3.8$ | | 0.0 | — | 17.88 | — |
| C | 5.08 E-4 | ALUMINA $\epsilon_r = 10.0$ | 2.79 E-3 | 1.24 E-3 | AIR/ REXOLITE ® | — | 16.1 |

$\epsilon_d = 37.6$
Cases A & B: 2R = 3.271 E-3 m, $t_d$ = 1.486 E-3 m
C: 2R = 3.277 E-3 m, $t_d$ = 1.478 E-3 m, 1.321 E-3 m diameter concentric hole.

The embodiment of FIG. 1 contains a dielectric resonator 100 which resonates at a radio frequency (RF) and which couples a signal containing a desired clock frequency 110 between microstrip lines 107 thus allowing oscillation to take place in the dielectric resonator oscillator loop. The dielectric resonator oscillator loop consists of the dielectric resonator 100, microstrip lines 107, phase shifter 105, amplifier 106 and directional coupler 108. A useful RF signal 109 is available at the output of the directional coupler 108.

In the embodiment of FIG. 1, the voltage-variable phase shifter 105 provides frequency correction and tuning, the amplifier 106 provides gain to overcome loop losses, and the directional coupler 108 provides the output signal. In coventional operation, oscillation re- Resonators were fabricated from Murata DRD ceramic material and were actually held in position above the alumina microstrip substrate by means of a low loss fixture attached to the upper ground plane. A 2 microinch polish was specified for the 99.6 percent alumina substrate. Microstrip and lower ground plane metalization consisted of 120 microinches of copper with a thin chrome base layer for adhesion and a thin gold surface layer for oxidation prevention.

Microstrip width was determined from a theory which includes dispersion to yield 50 ohms at approximately 16 GHz. Microstrip lengths were determined empirically with minimum insertion loss as the goal. Dielectric resonator position and cover height were chosen for a reasonable insertion loss vs Q tradeoff plus low resonator spurious and low electromagnetic feedthrough. An insertion loss as low as 5.3 dB (for a Q of 964) and a Q as high as 2344 (for an 18.3 dB insertion loss) could be achieved for other configurations. Package design also included the use of high-loss material for direct feedthrough suppression.

Figure 4:
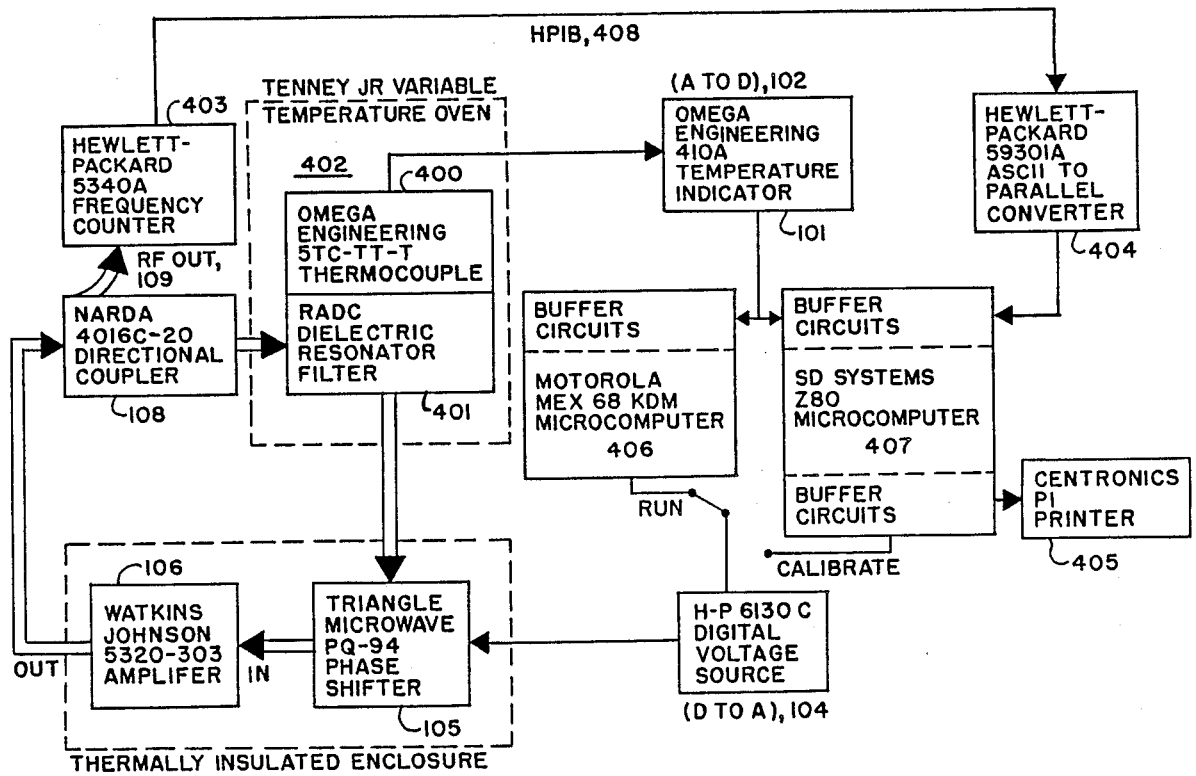
FIG. 4 is a block diagram of an embodiment of the invention with a calibration capability.

The excellent frequency stability, illustrated in FIG. 2 could be accomplished only over a restricted temperature range, due to the relatively high temperature sensitivity of the uncompensated oscillator. Adjustment of the temperature coefficient of the dielectric resonator itself, or changes in mounting and packaging, should improve the uncompensated performance (from the 8.6 ppm/° C. average value in FIG. 2 to at least the 3 ppm/° C. range of recent commercial oscillators) and thus widen the extent of compensation. FIG. 4 is a detailed schematic block diagram of the configuration that is used to calibrate and run the digitally compensated DRO of the present invention. In addition to the basic DRO loop plus the digital feedback circuit described in conjunction with FIG. 1 and needed to run the oscillator, the block diagram of FIG. 2 also includes the electronic circuitry necessary to calibrate the device and take data. For example, the dielectric resonator filter 401, is depicted as being enclosed in a variable temperature oven 402, as well as being electrically connected to the phase shifter 105, amplifier 106, and directional coupler 108. A frequency counter 403 measures the frequency of the RF 109, and conveys the information via a Hewlett-Packard interface bus 408, and ASCII to parallel converter 404, to the Z80 microcomputer 407. The temperature indicator provides both microcomputers 406 and 407 with a digital indication of the temperature of the dielectric resonator filter 401. Calibration is accomplished as a function of temperature under control of the Z80-based microcomputer 407 as follows.

After the phase shifter is adjusted, the actual frequency is compared with a pre-set desired frequency. When a match occurs, a valid calibration point results. That is, the phase shifter control word and corresponding input temperature word are recorded on the printer 405. After completion of the calibration experiment, this data can be processed to generate a lookup table or correction equation.

The lookup table consists of proper control words located at memory addresses which correspond to temperatures. Quadratic or higher-order polynomial extrapolation is used to fill all memory (temperature) locations from the limited experimental calibration data. In the run mode, a temperature setting simply causes the microcomputer 406 to fetch a phase shift control word from the appropriate memory location. For this case, microcomputer intelligence is not actually needed. Simple logic circuitry can address a programmable read only memory (PROM, EPROM, OR EEPROM) which then puts out the correct phase shifter control word on its data lines.

For the second type of control, the correction equation is created by fitting a second-or fourth-order curve to the raw calibration data. Far less memory is used in this case, since only the polynomial coefficients need to be stored together with a somewhat larger program. The proper phase shifter control word is then computed for each input temperature. Computation time is traded against memory. With the availability of microprocessor intelligence, additional features for an advanced DRO are also suggested. For example, rate of change of temperature can be monitored and compensation for circuit element aging becomes possible.

Practical, commercial off-the-shelf equipment is depicted in the configuration of FIG. 4. However, integrated circuit A/D and D/A converters, single chip microcomputers and a monolithic microwave integrated circuit (MMIC) DRO can be envisaged for final implementation of the compensated oscillators.

For experimental convenience, only the dielectric resonator filter itself was thermally cycled. Since the amplifier and phase shifter have a combined frequency sensitivity slightly exceeding 1 ppm./° C., they were encased in a thermally insulated enclosure. In a final implementation, where these parts of the oscillator are subject to thermal variations, the digital compensation removes their effects as well as that of the dielectric resonator filter.

All major components used to obtain the compensation data are illustrated in FIG. 4, except for an attenuator that allows adjustment of the open loop gain to approximately 3 dB. When high-Q, and therefore high insertion loss, filters are tested, attenuators can also be used as pads to improve SWR.

The circuit of FIG. 4 is used to obtain empirical data from the DRO running both compensated as described above and uncompensated with constant phase-shifter setting. Here, temperature and frequency are merely acquired and printed. The data for both curves of FIG. 2 were obtained in this manner.

Once the empirical data from the calibration configuration of FIG. 4 is gathered, it can be used to compose either: the look-up table for a PROM (indicating the proper phase shifter control word for a given temperature); or if a microcomputer is used, the correlation may be input into the microcomputer in the form of an algorithm relating phase shift to temperature. With the completion of the calibration process associated with FIG. 4, the configuration of the dielectric resonator oscillator with the thermal feedback circuit can revert to that depicted in FIG. 1. In the configuration of FIG. 1, compensation is accomplished as follows. At each temperature the phase shifter setting necessary to maintain a stable output frequency is provided by a precalibrated programmable read only memory 103 (PROM, EPROM or EEPROM) or RAM lookup table. An alternative to the simple lookup table is the use of a microcomputer to calculate the appropriate phase shifter setting from a preprogrammed equation.

Figure 5:
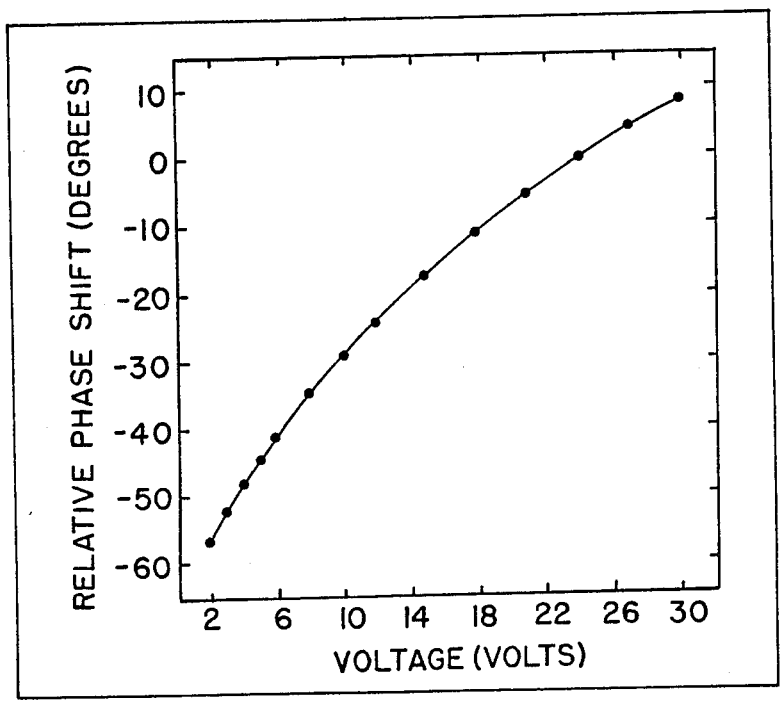
FIG. 5 is a chart of measured phase shifter characteristics.

One final comment concerning the block diagram of FIG. 4: by using digital compensation, it is not necessary to require the phase shifter to have linear phase vs voltage characteristics. For example, the type of device used here has measured characteristics as shown in FIG. 5.

Figure 6:
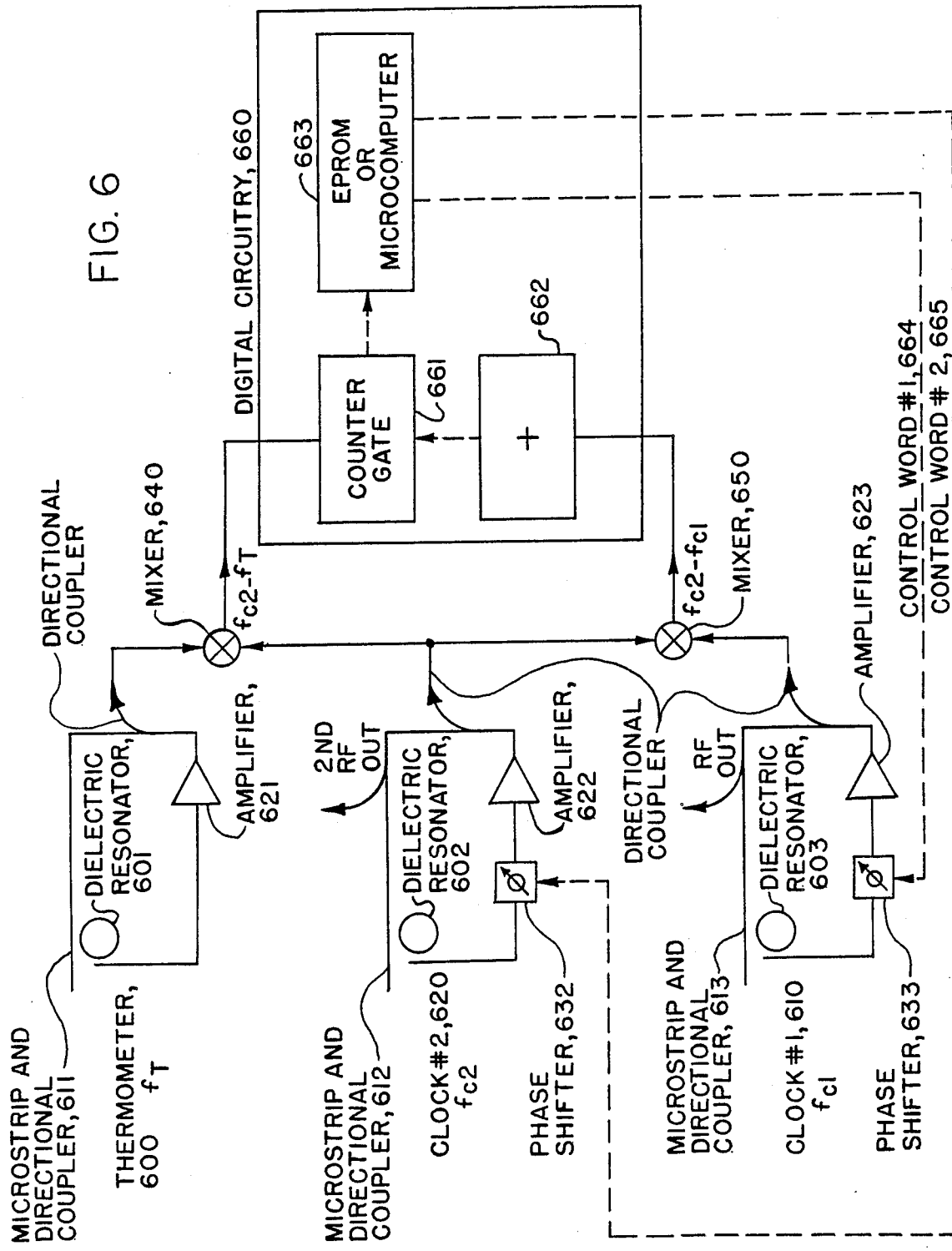
FIG. 6 is a schematic diagram of another embodiment of the present invention.

FIG. 6 is a schematic diagram of an alternate embodiment of a dielectric resonator oscillator with electronic temperature compensation. In this embodiment, three separate oscillator loops 600, 610, 620 are used, each having:

a dielectric resonator (601, 602 and 603);

microstrip lines and directional coupler(s) (611, 612, and 613) and an amplifier (621, 622, and 623).

The thermometer loop 600 has a relatively high temperature coefficient for increased temperature sensitivity compared to the other loops 610 and 620. The result of the increased temperature sensitivity is that the uncompensated (for temperature) output signal $f_T$ of the thermometer loop 600 is a signal that varies significantly with changes in the ambient temperature. The thermometer loop 600 serves a similar function to that of the temperature sensor 101 of the embodiment of the invention depicted in FIG. 1.

The first and second clock loops 610 and 620 each function like the loop of FIG. 1: their phase shifters 632 and 633 correct frequency drift in the loop in response to their respective control words 664 and 665 from the EPROM or microcomputer 663 in the digital circuitry 660.

The first mixer 640 of FIG. 6 produces an output signal $f_{c2}-f_T$ by mixing the output $f_{c2}$ of a clock loop 620 with the output $f_T$ of the thermometer loop 600. The output $f_{c2}-f_T$ of the first mixer 640 is at a sufficiently low frequency to be processed by the digital circuitry 660.

Similarly, the second mixer 650 produces its output signal $f_{c2}-f_{cl}$ by mixing the output signal $f_{c2}$ of clock loop 620 with the output signal $f_{cl}$ of clock loop 610. The output signal of the second mixer 650 is also sufficiently low to be processed by the digital circuitry 660, which produces the two control words 664 and 665 which are used by the phase shifters 632 and 633 to correct frequency drift in their respective loops.

The digital circuitry 660 consists of: a counter 661, gated from the divider 662, and a correlating means 663 which may be either an EPROM or microcomputer. The divider 662 receives and divides the output signal $f_{c2}-f_{cl}$ to produce a gate for the counter 661. The counter receives the output signal $f_{c2}-f_T$ from the first mixer 640 and the gate signal generated by the divider 662 and generates a count which corresponds to the ambient temperature. The correlation means 663 uses this ambient temperature reading in the manner described for element 103 in the embodiment of FIG. 1 to produce the control words 664 and 665, which enable the phase shifters 632 and 633 to compensate for the frequency drift in their respective loops.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. In combination with a dielectric resonator oscillator including a dielectric resonator which oscillates to produce a radio frequency (RF) clock signal which has phase shift characteristics corresponding to a resonant frequency, said resonant frequency having a frequency drift with changes in ambient temperature, said dielectric resonator oscillator including microstrip lines which are electrically connected in series with a directional coupler, said microstrip lines being placed in proximity to said dielectric resonator which couples said radio frequency clock signal between said microstrip lines thus closing the oscillator loop, a temperature compensation feedback circuit which reduces temperature sensitivity and frequency drift in said clock signal, said temperature compensation feedback circuit comprising:

a temperature sensing means which produces an output signal which indicates the ambient temperature, said output signal being a temperature reading;

a correlation menas which is electrically connected in series with said temperature sensing means, and which receives said temperature reading from said temperature sensing means, and produces an output signal which indicates an amount of phase adjustment which is necessary in said clock signal to eliminate frequency drift due to changes in the ambient temperature;

a digital-to-analog converter which is electrically connected in series with said correlation means, and which receives said output signal from said correlation means, and converts it into an analog siganl;

a phase shifter which is electrically connected in series with said digital-to-analog converter, and which receives said clock signal and said analog signal from said digital-to-analog converter, said phase shifter also being electrically connected with said microstrip lines, and outputting an adjusted clock signal which compensates for the phase shift in the dielectric resonator due to changes in the ambient temperature; and an ampliifer which is electrically connected in series between said phase shifter and said directional coupler, and which produces an output by receiving and amplifying said adjusted clock signal from said phase shifter.

2. A temperature compensation feedback circuit, as defined in claim 1, including a calibration means which is placed in proximity with said dielectric resonator and said microstrip lines, and which electrically connects with said directional coupler and said temperature sensing means, said calibration means performs a calibration by varying the ambient temperature around said dielectric resonator, measuring said frequency in said lock signal, and producing an appropriate amount of phase adjustment in the clock signal required to correct for drift in said frequency for corresponding ambient temperature readings, said calibration means being detachable from said compensation feedback circuit wen the calibration is complete, said calibration means obtaining data during calibration which is used to generate a correction table, said correction table being a correlation between variations of ambient temperature around the dielectric resonator and the amount of phase adjustment in the clock signal resulting therefrom.

3. A temperature compensation feedback circuit, as defined in lailm 2, wherein said calibration means comprises:

a variable temperature oven encompassing and heating to different ambient temperatures said dielectric resonator and microstrip lines, said ambient temperature being monitored by said temperature sensing means which indicates the ambient temperature around the dielectric resonator and microstrip lines;

a frequency counter which connects with said directional coupler, and, which produces an output signal which indicates the frequency of said clock signal as it passes through the directional coupler; and a control computer which is electrically connected with said temperature sensing means, and which receives said output signal from said temperature sensing means and said frequency signal from said frequency counter, said control computer producing a correction signal by comparing said frequency with the desired frequency, said control computer sending said temperature reading and said correction signal to printing means after producing it, said control computer sending control signals to said variable temperature oven to direct the heating to different ambient temperature by the variable oven.

4. A temperature sensitive compensation feedback circuit, as defined in claim 3, wherein said dielectric resonator oscillator is deemed a first dielectric rsonator oscillator producing a clock signal #1, and said temperature sensing means comprises:
   a temperature sensitive dielectric resonator oscillator which produces a temperature signal which has a frequency drift with changes in ambient temperature;
   a second dielectric resonator oscillator producing a clock signal #2;
   a first mixer means which produces an output signal by receiving and mixing the temperature signal of the temperature sensitive dielectric resonator oscillator with clock signal #2, said output signal of said first mixer means being the difference between clock signal #2 and said temperature signal; and
   a counter means producing the output signal of the temperature sensing means by receiving and counting the output signal of said first mixer means.

5. A temperature compensation feedback circuit, as defined in claim 4 wherein said correlation means comprises a programmable read-only-memory which has been programmed with said correction table which indicates an appropriate amount of phase adjustment required for corresponding ambient temperature readings, said programmable read-only-memory producing said output signals of said correlation means by using said output signal from said temperature sensing means to look up in said correction table an appropriate amount of given adjustment and output the appropriate amount of phase adjustment indicated therein.

6. A temperature compensation feedback circuit, as defined in claim 4 wherein said correlation means comprises a microcomputer which receives a correction algorithm from data obtained using said control computer, said correlation algorithm indicating an appropriate amount of phase adjustment required for corresponding ambient temperature readings to compensate for frequency drift in said clock signals caused by changes in the ambient temperature.

7. A temperature compensation feedback circuit, as defined in claim 3, wherein said temperature sensing means comprises:
   a thermistor; and
   an A to D converter.

8. A temperature compensation feedback circuit, as defined in claim 7, wherein said correlation means produces control words which are conducted by the digital-to-analog converter to the phase shifter of said dielectric resonator oscillator, said control words causing the phase shifter to correct any frequency drift in the clock signal.

9. A temperature compensation feedback circuit, as defined in claim 8, wherein said correlation means comprises a programmable read-only-memory which has been programmed with said correction table which indicates an appropriate amount of phase adjustment required for corresponding ambient temperature readings, said programmable read-only-memory producing said output signal of said correlation means by using said output signal from said temperature sensing means to look up in said correction table an appropriate amount of phase adjustment and outputting the appropriate amount of phase adjustment indicated therein.

10. A temperature compensation feedback circuit, as defined in claim 8, wherein said correlation means comprises a microcomputer which receives a correction algorithm from data obtained using said control computer, said correlation algorithm indicating an appropriate amount of phase adjustment required for corresponding ambient temperature readings to compensate for frequency drift in said clock signal caused by changes in the ambient temperature.

11. In combination with a dielectric resonator oscillator, including a dielectric resonator which oscillates to produce a radio frequency (RF) clock signal which has phase shift characteristics corresponding to a resonant frequency, said resonant frequency having a frequency drift with changes in ambient temperature, said dielectric resonator oscillator including microstrip lines which are eletrically connected in series with a directional coupler, said microstrip lines being placed in proximity to said dielectric resonator which couples said radio frequency (RF) clock signal between said microstrip lines thus closing the oscillator loop, a temperature compensation feedback process which reduces temperature sensitivity and frequency drift in the clock signal in said microstrip, said process comprising the steps of:
   sensing the ambient temperature around the dielectric resonator;
   using the ambient temperature to determine a phase shift to be applied to the clock signal which will compensate for frequency drift due to changes in the ambient temperature; and
   setting the phase shift in the oscillator loop to compensate for the frequency drift due to changes in ambient temperature.

12. A temperature compensation feedback process, as defined in claim 11, including a calibration step which produces a correction table which indicates an amount of phase adjustment required in said clock signal for corresponding ambient temperature readings, said calibration step comprising the following substeps:
   controlling the ambient temperature around the dielectric resonator so that it is set at a plurality of test temperatures;
   measuring the frequency in the clock signal as it passes through the directional coupler for each of the test temperatures;
   recording an amount of phase shift in the clock signal which compensates for frequency drift at each of the test temperatures;
   using the results of the recording step to extrapolate a complete correction table;
   sending the correction table to a correlation means which will perform the correlating step of the process.

13. A temperature compensation feedback process, as defined in claim 11, including a calibration step which produces a correction function which indicates an amount of phase adjustment required in said signal for corresponding temperature readings, said calibration step comprising the following substeps:
   controlling the ambient temperature around the dielectric resonator so that it is set at a plurality of test temperatures;
   measuring the frequency in the clock signal as it passes through the directional coupler for each of the test temperatures;
   recording an amount of phase shift in the clock signal which compensates for frequency drift at each of the test temperatures;
   using the results of the recording step to generate a correction function; and
   sending the correction function to a correlation means which will perform the correlating step of the process.

* * * * *